(12) United States Patent
Herron et al.

(10) Patent No.: US 8,476,989 B2
(45) Date of Patent: Jul. 2, 2013

(54) ELECTROMAGNETIC INTERFERENCE FILTER FOR AUTOMOTIVE ELECTRICAL SYSTEMS

(75) Inventors: Nicholas Hayden Herron, Redondo Beach, CA (US); Douglas S. Carlson, Hawthorne, CA (US); David Tang, Fontana, CA (US); Mark D. Korich, Chino Hills, CA (US)

(73) Assignee: GM Global Technology Operations LLC, Detroit, MI (US)

( * ) Notice: Subject to any disclaimer, the term of this patent is extended or adjusted under 35 U.S.C. 154(b) by 702 days.

(21) Appl. No.: 12/543,285

(22) Filed: Aug. 18, 2009

(65) Prior Publication Data
US 2011/0043303 A1 Feb. 24, 2011

(51) Int. Cl.
*H03H 7/00* (2006.01)
(52) U.S. Cl.
USPC .............................. 333/181; 333/112; 333/185
(58) Field of Classification Search
USPC ......................................... 333/112, 181, 185
See application file for complete search history.

(56) References Cited

U.S. PATENT DOCUMENTS

| 6,208,098 B1 * | 3/2001 | Kume et al. ............... 318/400.25 |
| 7,567,446 B2 | 7/2009 | Sugino et al. |
| 8,050,045 B2 | 11/2011 | Okuzawa et al. |

FOREIGN PATENT DOCUMENTS

| JP | 6151176 | * | 5/1994 |
| JP | 2010051044 | * | 3/2010 |

OTHER PUBLICATIONS

Chinese Patent and Trademark Office. Chinese Office Action dated Nov. 27, 2012 for Chinese Application No. 201010258014.5.

* cited by examiner

*Primary Examiner* — Robert Pascal
*Assistant Examiner* — Kimberly Glenn
(74) *Attorney, Agent, or Firm* — Ingrassia Fisher & Lorenz, P.C.

(57) ABSTRACT

A filter for an automotive electrical system includes a substrate having first and second conductive members. First and second input terminals are mounted to the substrate. The first input terminal is electrically connected to the first conductive member, and the second input terminal is electrically connected to the second conductive member. A plurality of capacitors are mounted to the substrate. Each of the capacitors is electrically connected to at least one of the first and second conductive members. First and second power connectors are mounted to the substrate. The first power connector is electrically connected to the first conductive member, and the second power connector is electrically connected to the second conductive member. A common mode choke is coupled to the substrate and arranged such that the common mode choke extends around at least a portion of the substrate and the first and second conductive members.

13 Claims, 6 Drawing Sheets

ELECTROMAGNETIC INTERFERENCE FILTER FOR AUTOMOTIVE ELECTRICAL SYSTEMS

STATEMENT REGARDING FEDERALLY SPONSORED RESEARCH OR DEVELOPMENT

This invention was made with Government support under DE-FC26-07NT43123, awarded by the US-Department of Energy. The Government has certain rights in this invention.

TECHNICAL FIELD

The present invention generally relates to automotive electrical systems, and more particularly relates to an electromagnetic interference (EMI) filter for automotive electrical systems.

BACKGROUND OF THE INVENTION

In recent years, advances in technology, as well as ever-evolving tastes in style, have led to substantial changes in the design of automobiles. One of the changes involves the complexity of the electrical systems within automobiles, particularly alternative propulsion vehicles that utilize voltage supplies, such as hybrid, battery electric, and fuel cell vehicles. Such alternative propulsion vehicles typically use one or more electric motors, often powered by direct current (DC) power sources, perhaps in combination with another actuator, to drive the wheels.

Such vehicles often use two separate voltage sources, such as a battery and a fuel cell, to power the electric motors that drive the wheels. Power electronics, such as direct current-to-direct current (DC/DC) converters, are typically used to manage and transfer the DC power from one of the voltage sources and convert to more or less voltage. Also, due to the fact that alternative propulsion automobiles typically include direct current (DC) power supplies, direct current-to-alternating current (DC/AC) inverters (or power inverters) are also provided to invert the DC power to alternating current (AC) power, which is generally required by the motors.

Because of the complexity of these electrical systems, various electromagnetic interference (EMI) is generated which can hinder the performance of some of the components, including inverters and converters. As a result, EMI filters are often provided to reduce any adverse effects from EMI. However, the filters typically utilize a rather high number of components, are somewhat large, and considerably increase costs.

Accordingly, it is desirable to provide an EMI filter for automotive electrical systems with a reduced number of parts and a smaller size, while decreasing costs. Furthermore, other desirable features and characteristics of the present invention will become apparent from the subsequent description taken in conjunction with the accompanying drawings and the foregoing technical field and background.

SUMMARY OF THE INVENTION

A filter for an automotive electrical system is provided. The filter includes a substrate having first and second conductive members, first and second input terminals mounted to the substrate, the first input terminal being electrically connected to the first conductive member and the second input terminal being electrically connected to the second conductive member, a plurality of capacitors mounted to the substrate, each of the capacitors being electrically connected to at least one of the first and second conductive members, first and second power connectors mounted to the substrate, the first power connector being electrically connected to the first conductive member and the second power connector being electrically connected to second conductive member, and a common mode choke coupled to the substrate and arranged such that the common mode choke extends around at least a portion of the substrate and the first and second conductive members.

An electromagnetic interference (EMI) filter for an automotive power electronics unit is provided. The filter includes a substrate having first and second conductive layers and an insulating layer therebetween, the substrate having first, second, and third portions, the third portion being between the first and second portions, first and second input terminals mounted on the first portion the substrate, the first input terminal being connected to the first conductive layer and the second input terminal being connected to the second conductive layer, a plurality of filtering capacitors mounted on the third portion of the substrate, each of the filtering capacitors being electrically connected to at least one of the first and second conductive layers, a common mode choke coupled to the substrate and arranged such that the common mode choke extends around at least a portion of the substrate and the first and second conductive layers, and first and second power connectors mounted on the second portion of the substrate, the first power connector being electrically connected to the first conductive layer and the second power connector being electrically connected to second conductive layer.

An automotive propulsion system is provided. The propulsion system includes an electric motor, at least one direct current (DC) voltage source, a power inverter coupled to the electric motor and the at least one DC voltage source, the power inverter having a plurality of power switching devices, an electromagnetic interference (EMI) filter coupled to the at least one DC voltage source and the power inverter, and a controller in operable communication with the power inverter and coupled to the electric motor and the at least one DC voltage source, the controller being configured to operate the plurality of power switching devices. The EMI filter includes a substrate having first and second conductive members, first and second input terminals mounted to the substrate, the first input terminal being connected to the first conductive member and the second input terminal being connected to the second conductive member, a plurality of filtering capacitors mounted to the substrate, each of the filtering capacitors being electrically connected to at least one of the first and second conductive members, first and second power connectors mounted to the substrate, the first power connector being electrically connected to the first conductive member and the second power connector being electrically connected to second conductive member, and a common mode choke coupled to the substrate and arranged such that the common mode choke extends around at least a portion of the substrate and the first and second conductive members.

DESCRIPTION OF THE DRAWINGS

The present invention will hereinafter be described in conjunction with the following drawing figures, wherein like numerals denote like elements.

DESCRIPTION OF AN EXEMPLARY EMBODIMENT

Figure 1:
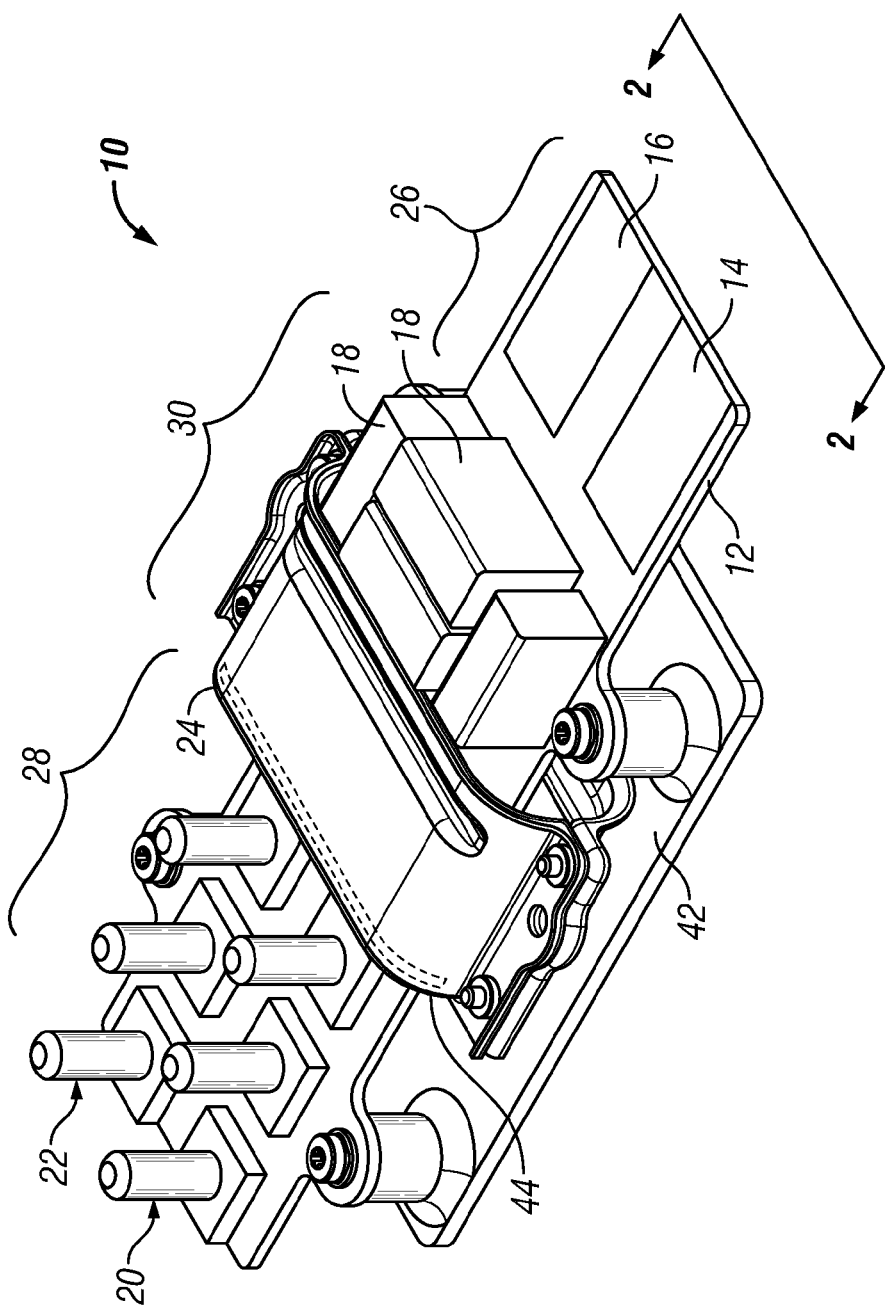
FIG. 1 is an isometric view of an electromagnetic interference (EMI) filter, according to one embodiment of the present invention.

The following detailed description is merely exemplary in nature and is not intended to limit the invention or the application and uses of the invention. Furthermore, there is no intention to be bound by any expressed or implied theory presented in the preceding technical field, background, brief summary, or the following detailed description.

The following description refers to elements or features being "connected" or "coupled" together. As used herein, "connected" may refer to one element/feature being mechanically joined to (or directly communicating with) another element/feature, and not necessarily directly. Likewise, "coupled" may refer to one element/feature being directly or indirectly joined to (or directly or indirectly communicating with) another element/feature, and not necessarily mechanically. However, it should be understood that although two elements may be described below, in one embodiment, as being "connected," in alternative embodiments similar elements may be "coupled," and vice versa. Thus, although the schematic diagrams shown herein depict example arrangements of elements, additional intervening elements, devices, features, or components may be present in an actual embodiment.

Further, various components and features described herein may be referred to using particular numerical descriptors, such as first, second, third, etc., as well as positional and/or angular descriptors, such as horizontal and vertical. However, such descriptors may be used solely for descriptive purposes relating to drawings and should not be construed as limiting, as the various components may be rearranged in other embodiments. It should also be understood that FIGS. 1-7 are merely illustrative and may not be drawn to scale.

FIG. 1 to FIG. 7 illustrate an electromagnetic interference (EMI) filter for an automotive electrical system. The filter includes a substrate having first and second conductive members. First and second input terminals are mounted to the substrate. The first input terminal is electrically connected to the first conductive member, and the second input terminal is electrically connected to the second conductive member. A plurality of capacitors are mounted to the substrate. Each of the capacitors is electrically connected to at least one of the first and second conductive members. First and second power connectors are mounted to the substrate. The first power connector is electrically connected to the first conductive member, and the second power connector is electrically connected to the second conductive member. A common mode choke is coupled to the substrate and arranged such that the common mode choke extends around at least a portion of the substrate and the first and second conductive members.

The filter may be electrically connected to an automotive power electronics unit (e.g., a direct current-to-alternating current (DC/AC) inverter or a direct current-to-direct current (DC/DC) converter). In one embodiment, the filter is integrated such that a single substrate is used, on which filter capacitors are mounted and around which a common mode choke extends.

Figure 2:
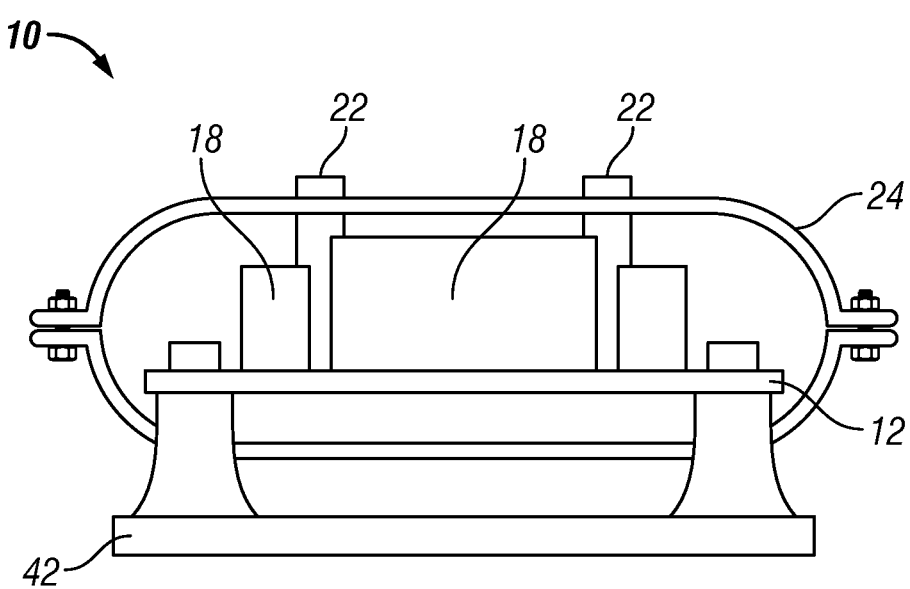
FIG. 2 is an end view of the EMI filter taken along line 2-2 in FIG. 1.
Figure 3:
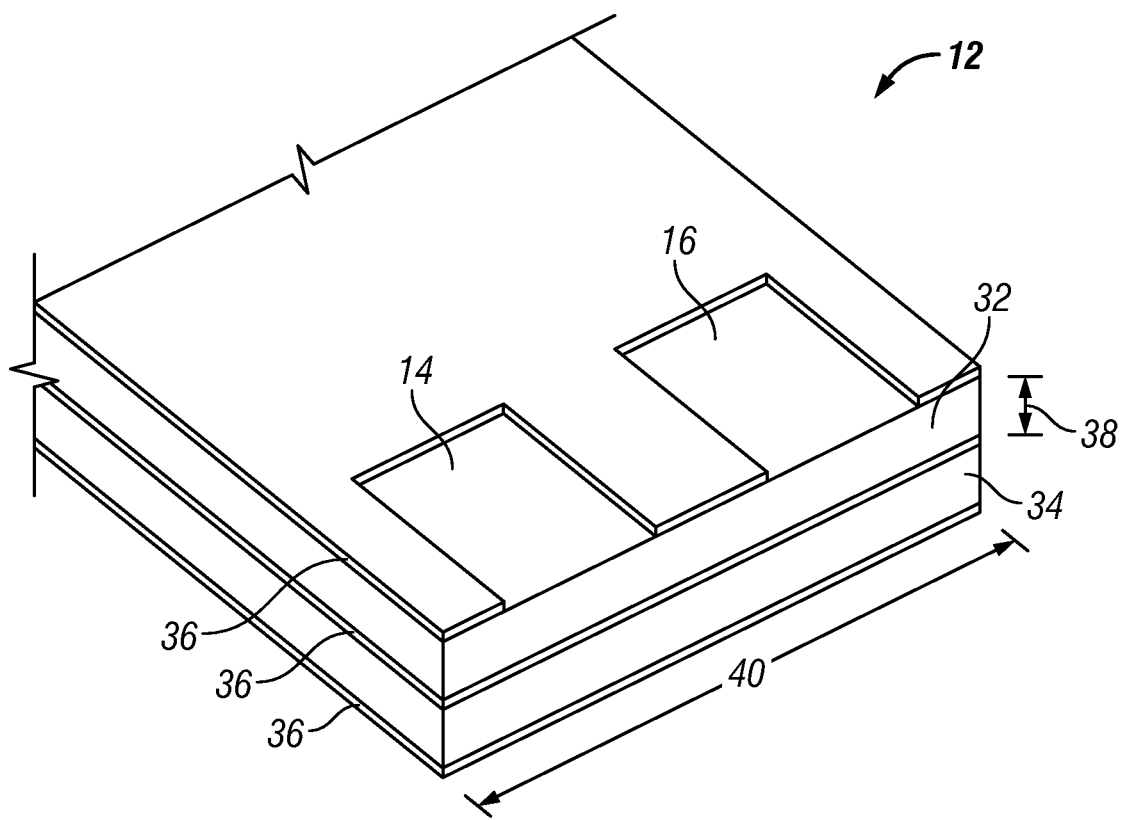
FIG. 3 is an isometric view of a portion of a substrate within the EMI filter of FIG. 1.

FIGS. 1, 2, and 3 illustrate an EMI filter 10, according to one embodiment of the present invention. The filter 10 includes a substrate 12, first and second input terminals 14 and 16, filtering capacitors 18, first and second sets of power connectors 20 and 22, and a common mode choke 24.

Referring to FIG. 1, the substrate 12 is substantially rectangular and has a first portion 26, a second portion 28, and a third portion 30. The first and second portions 26 and 28 correspond to respect ends of the substrate 12, while the third portion 30 corresponds to a central portion of the substrate 12 and is between the first and second portions 26 and 28. As shown in FIG. 3 (which is not drawn to scale), the substrate 12 includes a first conductive member 32, a second conductive member 34, and multiple insulating layers 36. In one embodiment, the first and second conductive members 32 and 34 are layers made of an electrically conductive material, such as copper, and each has a thickness 38 of, for example, between 100 micrometers (μm) and 1 millimeter (mm). As shown, the first and second conductive members 32 and 34 share a width 40 (at least at some portions thereof) that extends across the entirety of the substrate 12 (i.e., substantially across the length and width of the substrate), including between the first and second portions 26 and 28 of the substrate 12.

As shown, in the depicted embodiment, there are three insulating layers 36, with one between the first and second conductive members 32 and 34 and the other two forming respective upper and lower surfaces of the substrate 12. Although not shown, the insulating layers 36 have a thickness of, for example, between 50 μm and 0.5 mm. The insulating layers may be a "pre-preg" composite material, as is commonly understood. In one embodiment, the substrate 12 is a heavy copper circuit board, as is commonly understood in the art. The substrate 12 is mounted to a frame 42, which may be a portion of a frame or body of an automobile, as described below.

Referring to FIGS. 1 and 3, the input terminals 14 and 16 are on the first portion 26 of the substrate 12 and may essentially consist of exposed portions of the conductive members 32 and 34 (i.e., where portions of the insulating layer 36 on the upper surface of the substrate 12 have been removed). Although not shown in detail, it should be understood that the first input terminal is electrically connected (and perhaps integral with) the first conductive member 32, while the second input terminal 16 is electrically connected to the second conductive member 34 and electrically insulated from the first conductive member 32 (e.g., using conductive vias and insulators formed through the first conductive member 32).

The filtering capacitors 18 are mounted to the third portion 30 of the substrate 12, and include at least one "line-to-line" capacitor (e.g., "X" capacitor) and two "line-to-chassis" capacitor (e.g., "Y" capacitors), as are commonly understood. In particular, although not specifically illustrated, the X capacitor(s) is electrically connected between the first and second conductive members 32 and 34. One of the Y capacitors is electrically connected between the first conductive member 32 and a ground terminal (e.g., the frame 42), and the other Y capacitor is electrically connected between the second conductive member 34 and the ground terminal.

The first and second sets of power connectors 20 and 22 are mounted to the second portion 28 of the substrate 12. Each of the connectors 20 and 22 are substantially cylindrical, and are of the "male-type" of connector, as is commonly understood. Although not specifically shown, the first set of power connectors 20 is electrically connected to the first conductive member 32, and the second set of power connectors 22 is electrically connected to the second conductive member 34 while being insulated from the first conductive member 32.

Referring to FIGS. 1 and 2, the common mode choke 24 is in the shape of a closed, oval loop (i.e., with an opening therethrough) that wraps or extends around the third portion 30 of the substrate 12. The common mode choke 24 includes a ferrite core (or coil or loop) 42. In the depicted embodiment, the common mode choke 24 is neither mechanically nor electrically connected directly to the substrate 12 but is suspended in place by another portion of the frame which is not shown.

In use, the EMI filter 10 is electrically connected between, for example, a DC voltage source and a power electronics unit (e.g., an inverter or a converter). In particular, the input terminals 14 and 16 are electrically connected to respective positive (+) and negative (−) terminals of the voltage source and the power connectors 20 and 22 are connected to switches, or transistors, within the power electronics unit (e.g., the first set of connectors 20 may be connected to the source side of a first group of switches and the second set of connectors 22 may be connected to the drain side of a second group of switches). The first and second conductive members 32 and 34 serve as busbars, as current flows through the EMI filter 10. As will be appreciated by one skilled in the art, higher frequency "noise" is attenuated by the filtering capacitors 18 and the common mode choke 24, thereby improving the performance of the power electronics.

One advantage of the EMI filter described above is that because the input terminals, the filtering capacitors, the power connectors, and the conductive members (i.e., busbars) are integrated into one substrate, which extends through the common mode choke, the overall size and the number of components used in the filter are reduced. As a result, manufacturing costs are reduced and assembly is simplified.

Figure 4:
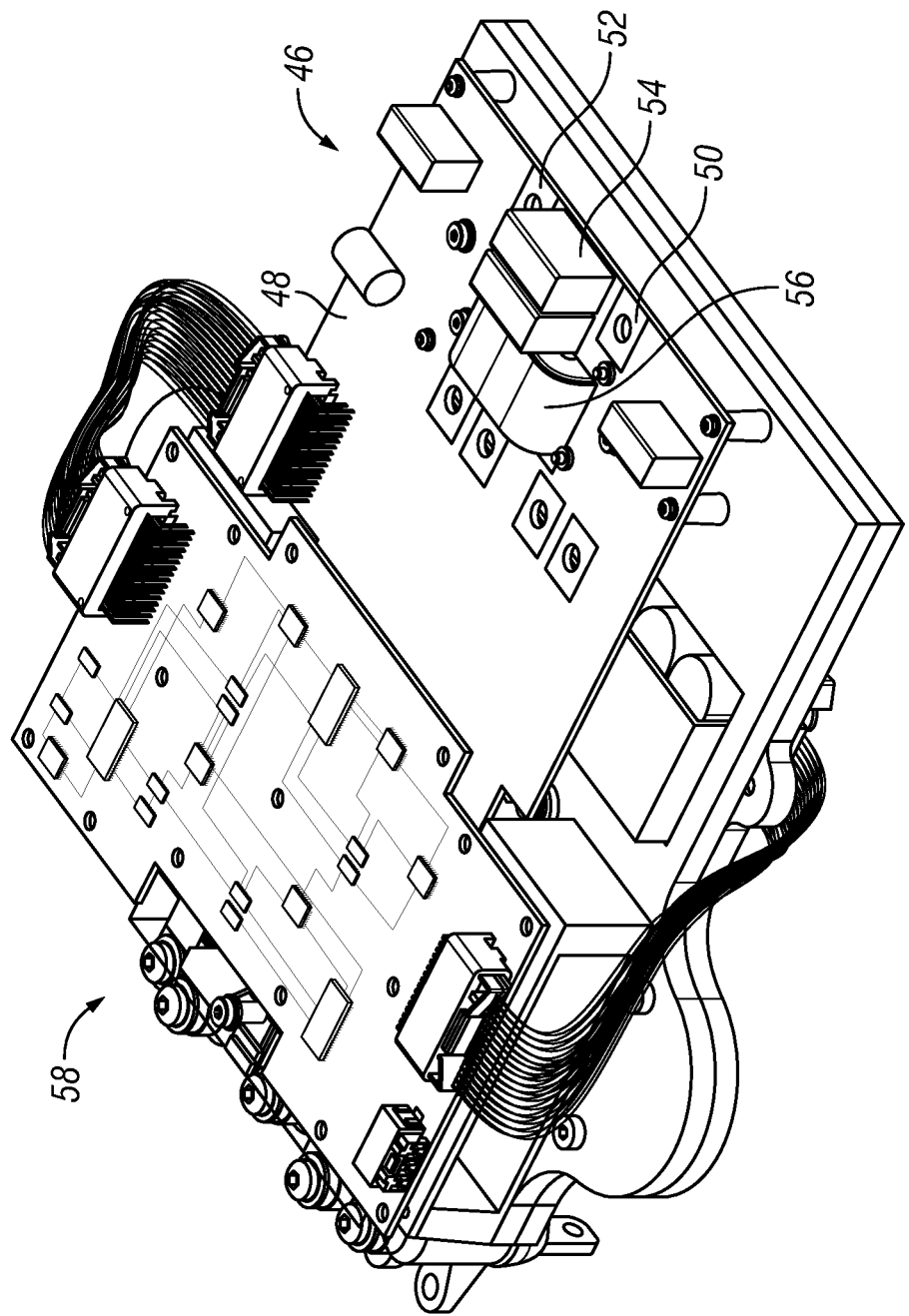
FIG. 4 is an isometric view of an EMI filter integrated with gate driver circuitry, according to another embodiment of the present invention.

FIG. 4 illustrates an EMI filter 46, according to another embodiment of the present invention. Similar to the EMI filter described above, the EMI filter 46 includes a substrate 48, first and second input terminals 50 and 52, filtering capacitors 54, and a common mode choke 56. Although not shown in detail, similar to the one described above, the substrate 48 includes first and second members, or busbars, that electrically interconnect the input terminals 50 and 52 and the filtering capacitors 54 and extend through the common mode choke 56. Of particular interest in FIG. 4 is that the EMI filter 46 is integrated with gate driver circuitry 58, as is commonly understood. That is, the EMI filter 46 is mechanically connected to the gate driver circuitry 58, and although not shown, the conductive members are electrically connected to the gate driver circuitry. It should also be understood that the substrate 48 may have other microelectronic components, such integrated circuits, mounted thereto which may account for some of the functionality of the gate driver circuitry 58.

A further advantage of the embodiment shown in FIG. 4 is that because the EMI filter is integrated with the gate driver circuitry, the total number of components may be further reduced. As a result, even more space may be saved, and costs may be further reduced.

Figure 5:
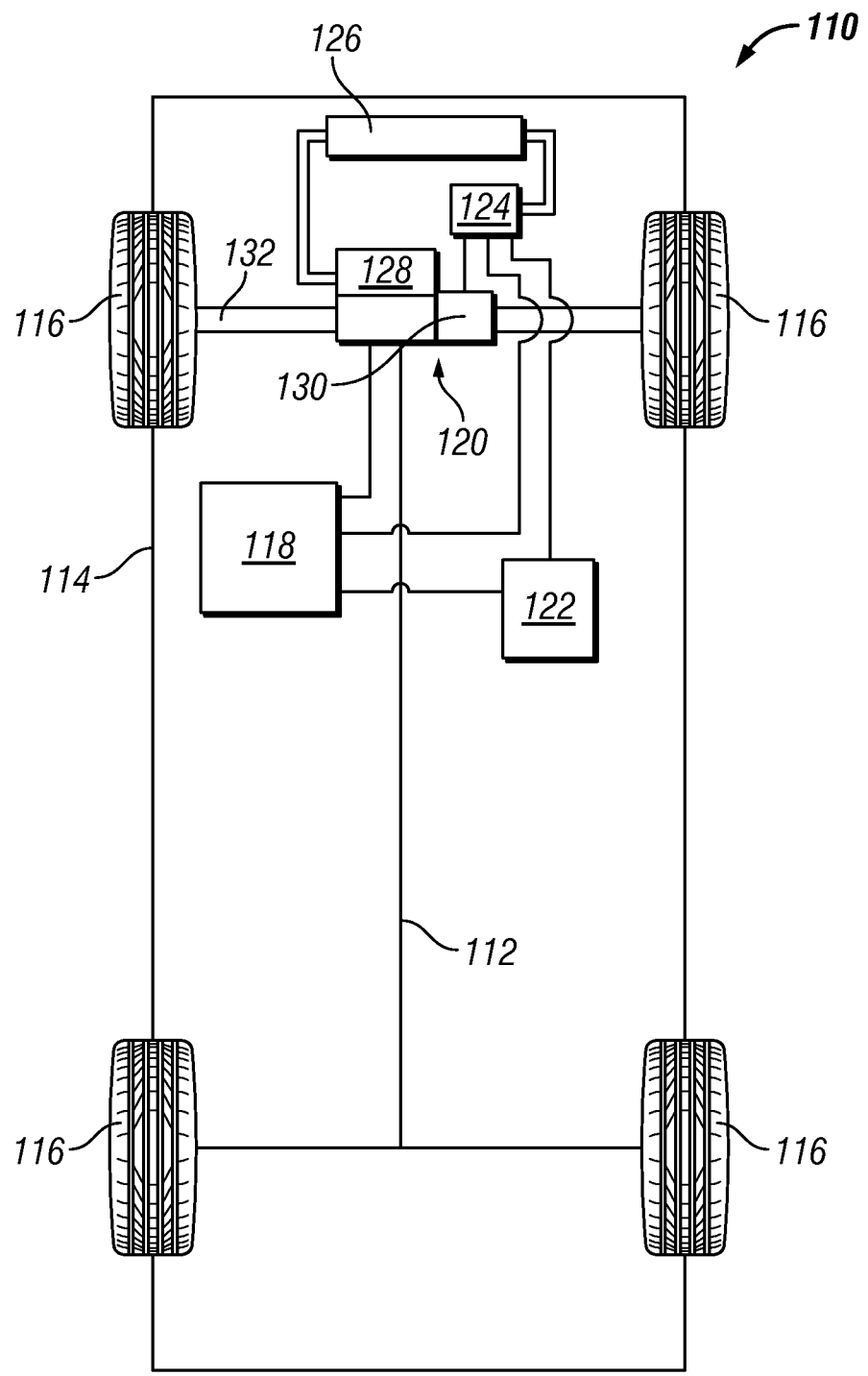
FIG. 5 is a schematic view of an exemplary automobile according to one embodiment of the present invention.

FIG. 5 illustrates an exemplary vehicle (or "automobile") 110, in which the EMI filters described above may be implemented. The automobile 110 includes a chassis 112, a body 114, four wheels 116, and an electronic control system 118. The body 114 is arranged on the chassis 112 and substantially encloses the other components of the automobile 110. The body 114 and the chassis 112 may jointly form a frame. The wheels 116 are each rotationally coupled to the chassis 112 near a respective corner of the body 114.

The automobile 110 may be any one of a number of different types of automobiles, such as, for example, a sedan, a wagon, a truck, or a sport utility vehicle (SUV), and may be two-wheel drive (2WD) (i.e., rear-wheel drive or front-wheel drive), four-wheel drive (4WD), or all-wheel drive (AWD). The automobile 110 may also incorporate any one of, or combination of, a number of different types of engines, such as, for example, a gasoline or diesel fueled combustion engine, a "flex fuel vehicle" (FFV) engine (i.e., using a mixture of gasoline and alcohol), a gaseous compound (e.g., hydrogen and/or natural gas) fueled engine, a combustion/electric motor hybrid engine (i.e., such as in a hybrid electric vehicle (HEV)), and an electric motor.

In the exemplary embodiment illustrated in FIG. 5, the automobile 110 is an HEV, and further includes an actuator assembly 120, a battery (or high voltage battery or DC voltage source) 122, a power converter assembly (e.g., an inverter or inverter assembly) 124, and a radiator 126. The actuator assembly 120 includes a combustion engine 128 and an electric motor/generator (or motor) 130.

Still referring to FIG. 5, the combustion engine 128 and/or the electric motor 130 are integrated such that one or both are mechanically coupled to at least some of the wheels 116 through one or more drive shafts 132. In one embodiment, the automobile 110 is a "series HEV," in which the combustion engine 128 is not directly coupled to the transmission, but coupled to a generator (not shown), which is used to power the electric motor 130. In another embodiment, the automobile 110 is a "parallel HEV," in which the combustion engine 128 is directly coupled to the transmission by, for example, having the rotor of the electric motor 130 rotationally coupled to the drive shaft of the combustion engine 128.

The radiator 126 is connected to the frame at an outer portion thereof and although not illustrated in detail, includes multiple cooling channels therein that contain a cooling fluid (i.e., coolant) such as water and/or ethylene glycol (i.e., "antifreeze") and is coupled to the engine 128 and the inverter 124.

Still referring to FIG. 5, in the depicted embodiment, the inverter 124 receives and shares coolant with the electric motor 130. However, other embodiments may use separate coolants for the inverter 124 and the electric motor 130. The radiator 126 may be similarly connected to the inverter 124 and/or the electric motor 130.

The electronic control system 118 is in operable communication with the actuator assembly 120, the high voltage battery 122, and the inverter 124. Although not shown in detail, the electronic control system 118 includes various sensors and automotive control modules, or electronic control units (ECUs), such as an inverter control module, a motor controller, and a vehicle controller, and at least one processor and/or a memory which includes instructions stored thereon (or in another computer-readable medium) for carrying out the processes and methods as described below.

Figure 6:
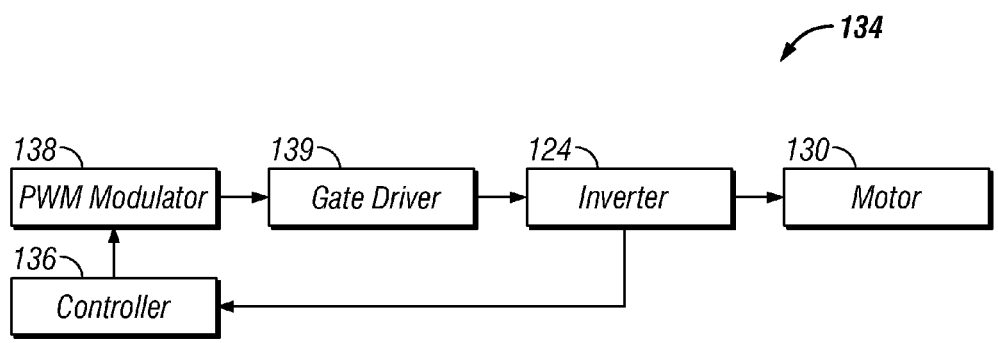
FIG. 6 is a block diagram of a voltage source inverter system within the automobile of FIG. 5.

FIG. 6 illustrates a voltage source inverter system (or electric drive system) 134, in accordance with an exemplary embodiment of the present invention. The voltage source inverter system 134 includes a controller 136 in operable communication with a Pulse Width Modulation (PWM) modulator 138 (or a pulse width modulator) and the inverter 124 (at an output thereof). The PWM modulator 138 is coupled to a gate driver 139, which in turn has an input coupled to an input of the inverter 124. The inverter 124 has a second output coupled to the motor 130. The controller 136 and the PWM modulator 138 may be integral with the electronic control system 118 shown in FIG. 1.

Figure 7:
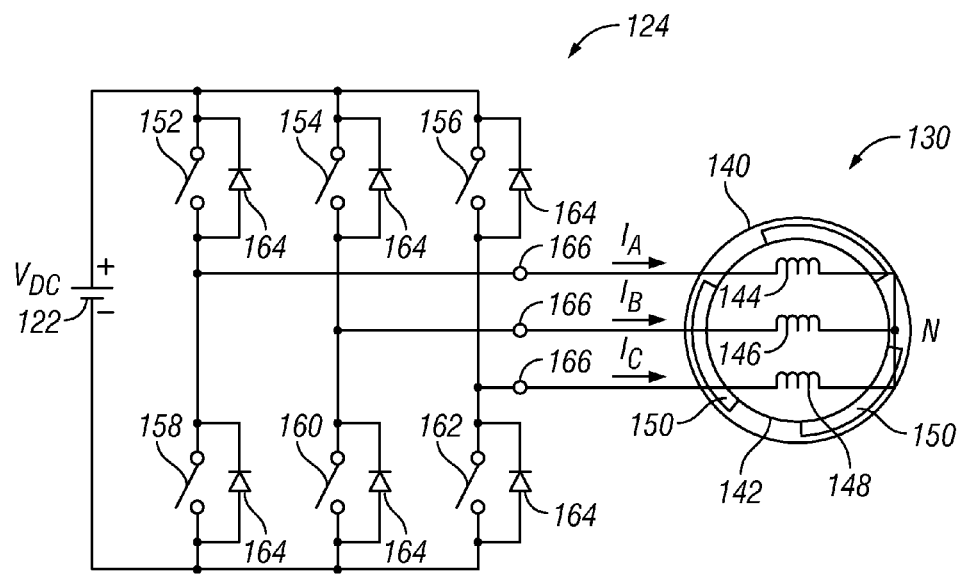
FIG. 7 is a schematic view of a battery, an inverter, and an electric motor within the automobile of FIG. 5.

FIG. 7 schematically illustrates the battery 122, the inverter 124, and the motor 130 of FIGS. 5 and 6 in greater detail. The inverter 124 includes a three-phase circuit coupled to the motor 130. More specifically, the inverter 124 includes a switch network having a first input coupled to the battery 122 (i.e., a voltage source ($V_{dc}$)) and an output coupled to the motor 130. Although a single voltage source is shown, a distributed DC link with two series sources may be used.

As will be appreciated by one skilled in the art, the electric motor 130, in one embodiment, includes a stator assembly 140 (including conductive coils or windings) and a rotor assembly 142 (including a ferromagnetic core and/or magnets), as well as a transmission and a cooling fluid (not shown). The stator assembly 140 includes a plurality (e.g., three) conductive coils or windings 144, 146, and 148, each of which is associated with one of three phases of the electric motor 130, as is commonly understood. The rotor assembly 142 includes a plurality of magnets 150 and is rotatably coupled to the stator assembly 140, as is commonly understood. The magnets 150 may include multiple electromagnetic poles (e.g., sixteen poles), as is commonly understood. It should be understood that the description provided above is intended as example of one type of electric motor that may be used. One skilled in the art will appreciate that the techniques described below may be applied to any type of electric motor.

The switch network comprises three pairs (a, b, and c) of series power switching devices (or switches) with antiparallel diodes (i.e., antiparallel to each switch) corresponding to each of the phases of the motor 130. Each of the pairs of series switches comprises a first switch, or transistor, (i.e., a "high" switch) 152, 154, and 156 having a first terminal coupled to a positive electrode of the battery 122 and a second switch (i.e., a "low" switch) 158, 160, and 162 having a second terminal coupled to a negative electrode of the battery 122 and a first terminal coupled to a second terminal of the respective first switch 152, 154, and 156.

As is commonly understood, each of the switches 152-162 may be in the form of individual semiconductor devices such as insulated gate bipolar transistors (IGBTs) within integrated circuits formed on semiconductor (e.g. silicon) substrates (e.g., die). As shown, a diode 164 is connected in an antiparallel configuration (i.e., "freewheeling diodes") to each of the switches 152-162. As such, each of the switches 152-162 and the respective diode 64 may be understood to form a switch-diode pair or set, six of which are included in the embodiment shown.

Still referring to FIG. 7, the inverter 124 and/or the motor 130 includes a plurality of current sensors 166, each of which is configured to detect the flow of current through a respective one of the windings 144, 146, and 148 of the motor 130 (and/or through the respective switches 152-162 or diodes 164).

It should be noted that the EMI filter 10 described above may be electrically connected between the battery 122 and the switches 152-162. In particular, the first input terminal 14 may be connected to the positive terminal (+) of the battery 122, and the second input terminal 16 may be connected to the negative terminal (−) of the battery 122. The first set of power connectors 20 may be electrically connected to the source sides of switches 152, 154, and 156, respectively. The second set of power connectors 22 may be electrically connected to the drain sides of switches 158, 160, and 162, respectively.

During normal operation (i.e., driving), referring to FIGS. 5, 6, and 7, the automobile 110 is operated by providing power to the wheels 116 with the combustion engine 128 and the electric motor 130 in an alternating manner and/or with the combustion engine 128 and the electric motor 130 simultaneously. In order to power the electric motor 130, DC power is provided from the battery 122 (and, in the case of a fuel cell automobile, a fuel cell) to the inverter 124, which converts the DC power into AC power, before the power is sent to the electric motor 130. As will be appreciated by one skilled in the art, the conversion of DC power to AC power is substantially performed by operating (i.e., repeatedly switching) the transistors within the inverter 124 at a "switching frequency," such as, for example, 12 kilohertz (kHz). Generally, the controller 136 produces a Pulse Width Modulation (PWM) signal for controlling the switching action of the inverter 124. The inverter 124 then converts the PWM signal to a modulated voltage waveform for operating the motor 130.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A filter for an automotive electrical system, the filter comprising:
   a substrate comprising first and second conductive members;
   first and second input terminals mounted to a first portion of the substrate;
   a plurality of capacitors mounted to the substrate;
   first and second power connectors mounted to a second portion of the substrate; and
   a common mode choke coupled to the substrate and arranged such that the common mode choke extends around a third portion of the substrate,
   wherein the first and second portions of the substrate are on opposing sides of the third portion of the substrate.

2. The filter of claim 1, wherein the capacitors are mounted to the third portion of the substrate.

3. The filter of claim 1, wherein the first and second conductive members are each an integral piece of metal that extends between the first and second portions of the substrate.

4. The filter of claim 3, wherein the substrate has a substrate width, and the first and second conductive members have respective first and second widths, the first and second widths being substantially the same as the substrate width.

5. The filter of claim 4, wherein the first conductive member is a first copper layer, the second conductive member is a second copper layer, and wherein the substrate further comprises an insulating layer between the first and second copper layers.

6. The filter of claim 1, further comprising an integrated circuit mounted to the substrate.

7. An electromagnetic interference (EMI) filter for an automotive power electronics unit comprising:
   a substrate comprising first and second conductive layers and an insulating layer therebetween, the substrate having first, second, and third portions, the third portion being between the first and second portions;
   first and second input terminals mounted on the first portion the substrate;
   a plurality of filtering capacitors mounted on the third portion of the substrate;
   a common mode choke coupled to the substrate and arranged such that the common mode choke extends around the third portion of the substrate and the first and second conductive layers; and first and second power connectors mounted on the second portion of the substrate.

8. The filter of claim 7, wherein the first and second conductive layers are each an integral piece of metal that extends between the first and second portions of the substrate.

9. The filter of claim 7, wherein the substrate has a substrate width, and the first and second conductive layers have respective first and second widths, the first and second widths being substantially the same as the substrate width.

10. An automotive propulsion system comprising:
an electric motor;
at least one direct current (DC) voltage source;
a power inverter coupled to the electric motor and the at least one DC voltage source, the power inverter comprising a plurality of power switching devices;
an electromagnetic interference (EMI) filter coupled to the at least one DC voltage source and the power inverter, the EMI filter comprising:
  a substrate comprising first and second conductive members;
  first and second input terminals mounted to a first portion of the substrate;
  a plurality of capacitors mounted to the substrate;
  first and second power connectors mounted to a second portion of the substrate; and
  a common mode choke coupled to the substrate and arranged such that the common mode choke extends around a third portion of the substrate,
  wherein the first and second portions of the substrate are on opposing sides of the third portion of the substrate
a controller in operable communication with the power inverter and coupled to the electric motor and the at least one DC voltage source, the controller being configured to operate the plurality of power switching devices.

11. The automotive drive system of claim 10, wherein the first and second conductive members are each an integral piece of metal that extends between the first and second portions of the substrate.

12. The automotive drive system of claim 11, wherein the substrate has a substrate width, and the first and second conductive members have respective first and second widths, the first and second widths being substantially the same as the substrate width.

13. The automotive drive system of claim 12, wherein the first conductive member is a first copper layer, the second conductive member is a second copper layer, and wherein the substrate further comprises an insulating layer between the first and second copper layers.

* * * * *